US012626892B2

(12) United States Patent
    Asahara

(10) Patent No.:    US 12,626,892 B2
(45) Date of Patent:     May 12, 2026

(54) SUBSTRATE PROCESSING APPARATUS

(71) Applicant: Tokyo Electron Limited, Tokyo (JP)

(72) Inventor: Masanori Asahara, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 447 days.

(21) Appl. No.: 18/459,189

(22) Filed: Aug. 31, 2023

(65) Prior Publication Data

US 2024/0079219 A1     Mar. 7, 2024

(30) Foreign Application Priority Data

Sep. 5, 2022    (JP) .................................. 2022-140721

(51) Int. Cl.
   *H01J 37/32*         (2006.01)

(52) U.S. Cl.
   CPC .. *H01J 37/32724* (2013.01); *H01J 37/32568* (2013.01); *H01J 37/32642* (2013.01)

(58) Field of Classification Search
   CPC ........... H01J 37/32724; H01J 37/32568; H01J 37/32642; H01J 37/20; B05B 1/14; B05B 1/34; B05B 12/18; H10N 19/00; H10N 30/2023; H10N 30/2027; H10N 30/802; H10N 30/88

USPC ......... 118/724, 725; 156/345.52; 204/298.15
See application file for complete search history.

(56) References Cited

FOREIGN PATENT DOCUMENTS

JP         2016-012593 A     1/2016

*Primary Examiner* — Rodney G Mcdonald
(74) *Attorney, Agent, or Firm* — Studebaker Brackett PLLC

(57) ABSTRACT

In an exemplary embodiment, a substrate processing apparatus is provided. The substrate processing apparatus includes a processing chamber, a substrate support stage. The piezoelectric element is disposed around an opening of the second nozzle to reduce a cross-sectional area of the opening of the second nozzle in accordance with a voltage applied thereto. The thermoelectric element is disposed between the first collection pipe and the second collection pipe to generate an electromotive force corresponding to a temperature difference between the heat transfer medium in the first collection pipe and the heat transfer medium in the second collection pipe. The drive circuit is configured to apply a voltage corresponding to a magnitude of the electromotive force, to the piezoelectric element.

7 Claims, 13 Drawing Sheets

SUBSTRATE PROCESSING APPARATUS

CROSS-REFERENCE TO RELATED APPLICATIONS

This application is based on and claims the benefit of priority from Japanese Patent Application No. 2022-140721 filed on Sep. 5, 2022, the entire contents of which are incorporated herein by reference.

FIELD

Exemplary embodiments of the present disclosure relate to a substrate processing apparatus.

BACKGROUND

A substrate processing apparatus may include a substrate support stage capable of controlling the temperature of a substrate placed on the substrate support stage. In a substrate processing apparatus described in Japanese Unexamined Patent Publication No. 2016-12593 the temperature of a substrate is controlled by supplying a heat transfer medium prepared at a first temperature and a heat transfer medium prepared at a second temperature higher than the first temperature to a substrate support stage.

SUMMARY

In an exemplary embodiment, a substrate processing apparatus is provided. The substrate processing apparatus includes a processing chamber, a substrate support stage, a first supply pipe, a second supply pipe, a first partition, a second partition, a first collection pipe, a second collection pipe, a piezoelectric element, a thermoelectric element, and a drive circuit. The substrate support stage is disposed in the processing chamber. The substrate support stage includes an upper surface and a lower surface. The upper surface supports a substrate placed thereon. The lower surface is on a side opposite to the upper surface. The substrate support stage provides a first recess and a second recess. The first recess and the second recess open downward. The first supply pipe includes a first nozzle. The first nozzle opens upward in the first recess. The first supply pipe is configured to supply a heat transfer medium to the first recess. The second supply pipe includes a second nozzle. The second nozzle opens upward in the second recess. The second supply pipe is configured to supply the heat transfer medium to the second recess. The first partition forms a first space together with the substrate support stage. The first space includes the first recess. The second partition forms a second space together with the substrate support stage. The second space includes the second recess. The first collection pipe is configured to collect the heat transfer medium from the first space. The second collection pipe is configured to collect the heat transfer medium from the second space. The piezoelectric element is disposed around an opening of the second nozzle to reduce a cross-sectional area of the opening of the second nozzle in accordance with a voltage applied thereto. The thermoelectric element is disposed between the first collection pipe and the second collection pipe to generate an electromotive force corresponding to a temperature difference between the heat transfer medium in the first collection pipe and the heat transfer medium in the second collection pipe. The drive circuit is configured to apply a voltage corresponding to a magnitude of the electromotive force, to the piezoelectric element.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

Figure 1:
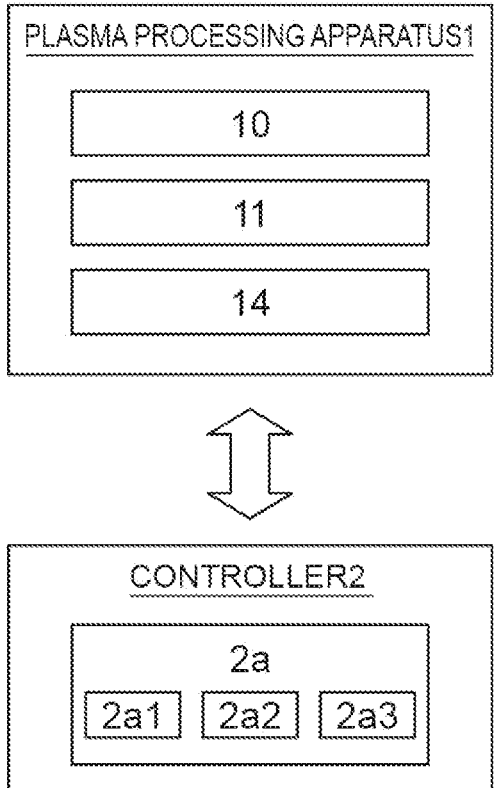
FIG. 1 is a diagram for describing a configuration example of a plasma processing system according to an exemplary embodiment.

FIG. 1 illustrates an example configuration of a wafer processing system. In an embodiment, the wafer processing system includes a plasma processing apparatus 1 and a controller 2. The plasma processing apparatus 1 is an example substrate processing apparatus, wafer processing system is an example substrate processing system. The plasma processing apparatus 1 includes a processing chamber 10, a substrate support 11, and a plasma generator 14. The processing chamber 10 has a plasma processing space. The processing chamber 10 further has at least one gas inlet for supplying at least one process gas into the plasma processing space and at least one gas outlet for exhausting gases from the plasma processing space. The gas inlet is connected to a gas supply 20 described below and the gas outlet is connected to a gas exhaust system 40 described below. The substrate support 11 is disposed in a plasma processing space and has a substrate supporting surface for supporting a substrate.

The plasma generator 14 is configured to generate a plasma from the at least one process gas supplied into the plasma processing space. The plasma formed in the plasma processing space may be, for example, a capacitively coupled plasma (CCP), an inductively coupled plasma (ICP), an electron-cyclotron-resonance (ECR) plasma, a helicon wave plasma (HWP), or a surface wave plasma (SWP). Various types of plasma generators may also be used, such as an alternating current (AC) plasma generator and a direct current (DC) plasma generator. In an embodiment, AC signal (AC power) used in the AC plasma generator has a frequency in a range of 100 kHz to 10 GHz. Hence, examples of the AC signal include a radio frequency (RF) signal and a microwave signal. In an embodiment, the RF signal has a frequency in a range of 100 kHz to 150 MHz.

The controller 2 processes computer executable instructions causing the plasma processing apparatus 1 to perform various steps described in this disclosure. The controller 2 may be configured to control individual components of the plasma processing apparatus 1 such that these components execute the various steps. In an embodiment, the functions of the controller 2 may be partially or entirely incorporated into the plasma processing apparatus 1. The controller 2 may include a processor 2*a*1, a storage 2*a*2, and a communication interface 2*a*3. The controller 2 is implemented in, for example, a computer 2*a*. The processor 2*a*1 may be configured to read a program from the storage 2*a*2, and then perform various controlling operations by executing the program. This program may be preliminarily stored in the storage 2*a*2 or retrieved from any medium, as appropriate. The resulting program is stored in the storage 2*a*2, and then the processor 2*a*1 reads to execute the program from storage 2*a*2. The medium may be of any type which can be accessed by the computer 2*a* or may be a communication line connected to the communication interface 2*a*3. The processor 2*a*1 may be a central processing unit (CPU). The storage 2*a*2 may include a random access memory (RAM), a read only memory (ROM), a hard disk drive (HDD), a solid state drive (SSD), or any combination thereof. The communication interface 2*a*3 can communicate with the plasma processing apparatus 1 via a communication line, such as a local area network (LAN).

Figure 2:
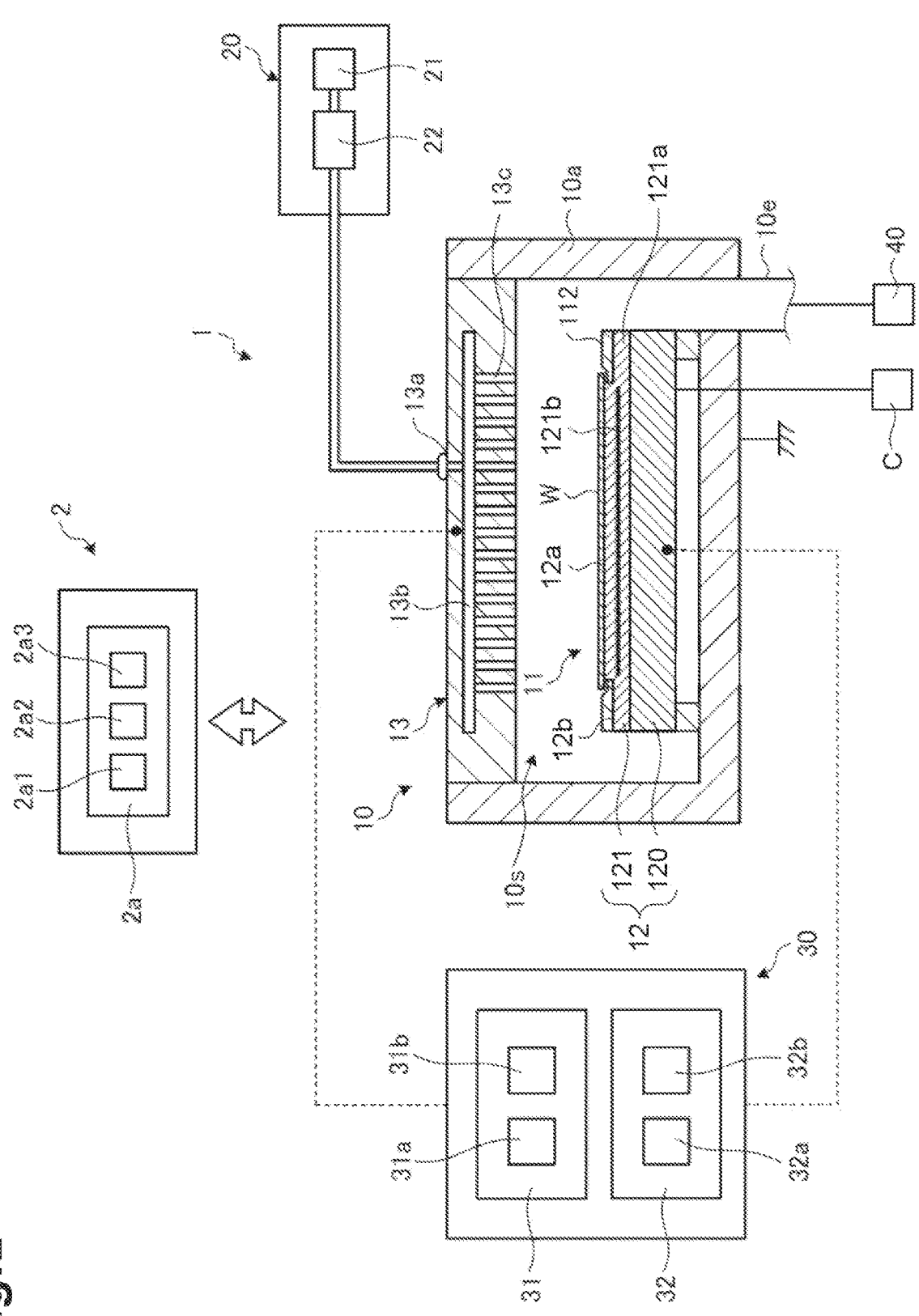
FIG. 2 is a diagram for describing a configuration example of a capacitively-coupled plasma processing apparatus according to the exemplary embodiment.

An example configuration of a capacitively coupled plasma processing apparatus, which is an example of the plasma processing apparatus 1, will now be described. FIG. 2 illustrates the example configuration of the capacitively coupled plasma processing apparatus.

The capacitively coupled plasma processing apparatus 1 includes a processing chamber 10, a gas supply 20, an electric power source 30, and a gas exhaust system 40. The plasma processing apparatus 1 further includes a substrate support 11 and a gas introduction unit. The gas introduction unit is configured to introduce at least one process gas into the processing chamber 10. The gas introduction unit includes a showerhead 13. The substrate support 11 is disposed in a processing chamber 10. The showerhead 13 is disposed above the substrate support 11. In an embodiment, the showerhead 13 functions as at least part of the ceiling of the processing chamber 10. The processing chamber 10 has a plasma processing space 10*s* that is defined by the showerhead 13, the sidewall 10*a* of the processing chamber 10, and the substrate support 11. The processing chamber 10 is grounded. The showerhead 13 and the substrate support 11 are electrically insulated from the housing of the processing chamber 10. In one embodiment, the plasma processing apparatus 1 may include a circulation device C. The detail of the circulation device C is described below.

The substrate support 11 includes a substrate support stage 12 and a ring assembly 112. The substrate support stage 12 has a central region 12*a* for supporting a substrate W and an annular region 12*b* for supporting the ring assembly 112. An example of the substrate W is a wafer. The annular region 12*b* of the substrate support stage 12 surrounds the central region 12*a* of the substrate support stage 12 in plan view. The substrate W is disposed on the central region 12*a* of the substrate support stage 12, and the ring assembly 112 is disposed on the annular region 12*b* of the substrate support stage 12 so as to surround the substrate W on the central region 12*a* of the substrate support stage 12. Thus, the central region 12*a* is also called a substrate supporting surface for supporting the substrate W, while the annular region 12*b* is also called a ring supporting surface for supporting the ring assembly 112.

In an embodiment, the substrate support stage 12 includes a base 120 and an electrostatic chuck 121. The base 120 includes a conductive member. The conductive member of the base 120 can function as a lower electrode. The electrostatic chuck 121 is disposed on the base 120. The electrostatic chuck 121 includes a ceramic member 121*a* and an electrostatic electrode 121*b* disposed in the ceramic member 121*a*. The ceramic member 121*a* has the central region 12*a*. In an embodiment, the ceramic member 121*a* also has the annular region 12*b*. Any other member, such as an annular electrostatic chuck or an annular insulting member, surrounding the electrostatic chuck 121 may have the annular region 12*b*. In this case, the ring assembly 112 may be disposed on either the annular electrostatic chuck or the annular insulating member, or both the electrostatic chuck 121 and the annular insulating member. At least one RF/DC electrode coupled to an RF source 31 and/or a DC source 32 described below may be disposed in the ceramic member 121*a*. In this case, the at least one RF/DC electrode functions as the lower electrode. If a bias RF signal and/or DC signal described below are supplied to the at least one RF/DC electrode, the RF/DC electrode is also called a bias electrode. It is noted that the conductive member of the base 120 and the at least one RF/DC electrode may each function as a lower electrode. The electrostatic electrode 121*b* may also be function as a lower electrode. The substrate support 11 accordingly includes at least one lower electrode.

The ring assembly 112 includes one or more annular members. In an embodiment, the annular members include one or more edge rings and at least one cover ring. The edge ring is composed of a conductive or insulating material, whereas the cover ring is composed of an insulating material.

The showerhead 13 is configured to introduce at least one process gas from the gas supply 20 into the plasma processing space 10*s*. The showerhead 13 has at least one gas inlet 13*a*, at least one gas diffusing space 13*b*, and a plurality of gas feeding ports 13*c*. The process gas supplied to the gas inlet 13*a* passes through the gas diffusing space 13*b* and is then introduced into the plasma processing space 10*s* from the gas feeding ports 13*c*. The showerhead 13 further includes at least one upper electrode. The gas introduction unit may include one or more side gas injectors provided at one or more openings formed in the sidewall 10*a*, in addition to the showerhead 13.

The gas supply 20 may include at least one gas source 21 and at least one flow controller 22. In an embodiment, the gas supply 20 is configured to supply at least one process gas from the corresponding gas source 21 through the corresponding flow controller 22 into the showerhead 13. Each flow controller 22 may be, for example, a mass flow controller or a pressure-controlled flow controller. The gas supply 20 may include a flow modulation device that can modulate or pulse the flow of the at least one process gas.

The electric power source 30 include an RF source 31 coupled to the processing chamber 10 through at least one impedance matching circuit. The RF source 31 is configured to supply at least one RF signal (RF power) to at least one lower electrode and/or at least one upper electrode. A plasma is thereby formed from at least one process gas supplied into the plasma processing space 10s. Thus, the RF source 31 can function as at least part of the plasma generator 14. The bias RF signal supplied to the at least one lower electrode causes a bias potential to occur in the substrate W, which potential then attracts ionic components in the plasma to the substrate W.

In an embodiment, the RF source 31 includes a first RF generator 31a and a second RF generator 31b. The first RF generator 31a is coupled to the at least one lower electrode and/or the at least one upper electrode through the at least one impedance matching circuit and is configured to generate a source RF signal (source RF power) for generating a plasma. In an embodiment, the source RF signal has a frequency in a range of 10 MHz to 150 MHz. In an embodiment, the first RF generator 31a may be configured to generate two or more source RF signals having different frequencies. The resulting source RF signal(s) is supplied to the at least one lower electrode and/or the at least one upper electrode.

The second RF generator 31b is coupled to the at least one lower electrode through the at least one impedance matching circuit and is configured to generate a bias RF signal (bias RF power). The bias RF signal and the source RF signal may have the same frequency or different frequencies. In an embodiment, the bias RF signal has a frequency which is less than that of the source RF signal. In an embodiment, the bias RF signal has a frequency in a range of 100 kHz to 60 MHz. In an embodiment, the second RF generator 31b may be configured to generate two or more bias RF signals having different frequencies. The resulting bias RF signal(s) is supplied to the at least one lower electrode. In various embodiments, at least one of the source RF signal and the bias RF signal may be pulsed.

The electric power source 30 may also include a DC source 32 coupled to the processing chamber 10. The DC source 32 includes a first DC generator 32a and a second DC generator 32b. In an embodiment, the first DC generator 32a is connected to the at least one lower electrode and is configured to generate a first DC signal. The resulting first DC signal is applied to the at least one lower electrode. In an embodiment, the second DC generator 32b is connected to the at least one upper electrode and is configured to generate a second DC signal. The resulting second DC signal is applied to the at least one upper electrode.

In various embodiments, the first and second DC signals may be pulsed. In this case, a sequence of voltage pulses is applied to the at least one lower electrode and/or the at least one upper electrode. The voltage pulses have rectangular, trapezoidal, or triangular waveform, or a combined waveform thereof. In an embodiment, a waveform generator for generating a sequence of voltage pulses from the DC signal is disposed between the first DC generator 32a and the at least one lower electrode. The first DC generator 32a and the waveform generator thereby functions as a voltage pulse generator. In the case that the second DC generator 32b and the waveform generator functions as a voltage pulse generator, the voltage pulse generator is connected to the at least one upper electrode. The voltage pulse may have positive polarity or negative polarity. A sequence of voltage pulses may also include one or more positive voltage pulses and one or more negative voltage pulses in a cycle. The first and second DC generators 32a, 32b may be disposed in addition to the RF source 31, or the first DC generator 32a may be disposed in place of the second RF generator 31b.

The gas exhaust system 40 may be connected to, for example, a gas outlet 10e provided in the bottom wall of the processing chamber 10. The gas exhaust system 40 may include a pressure regulation valve and a vacuum pump. The pressure regulation valve enables the pressure in the plasma processing space 10s to be adjusted. The vacuum pump may be a turbo-molecular pump, a dry pump, or a combination thereof.

Figure 3:
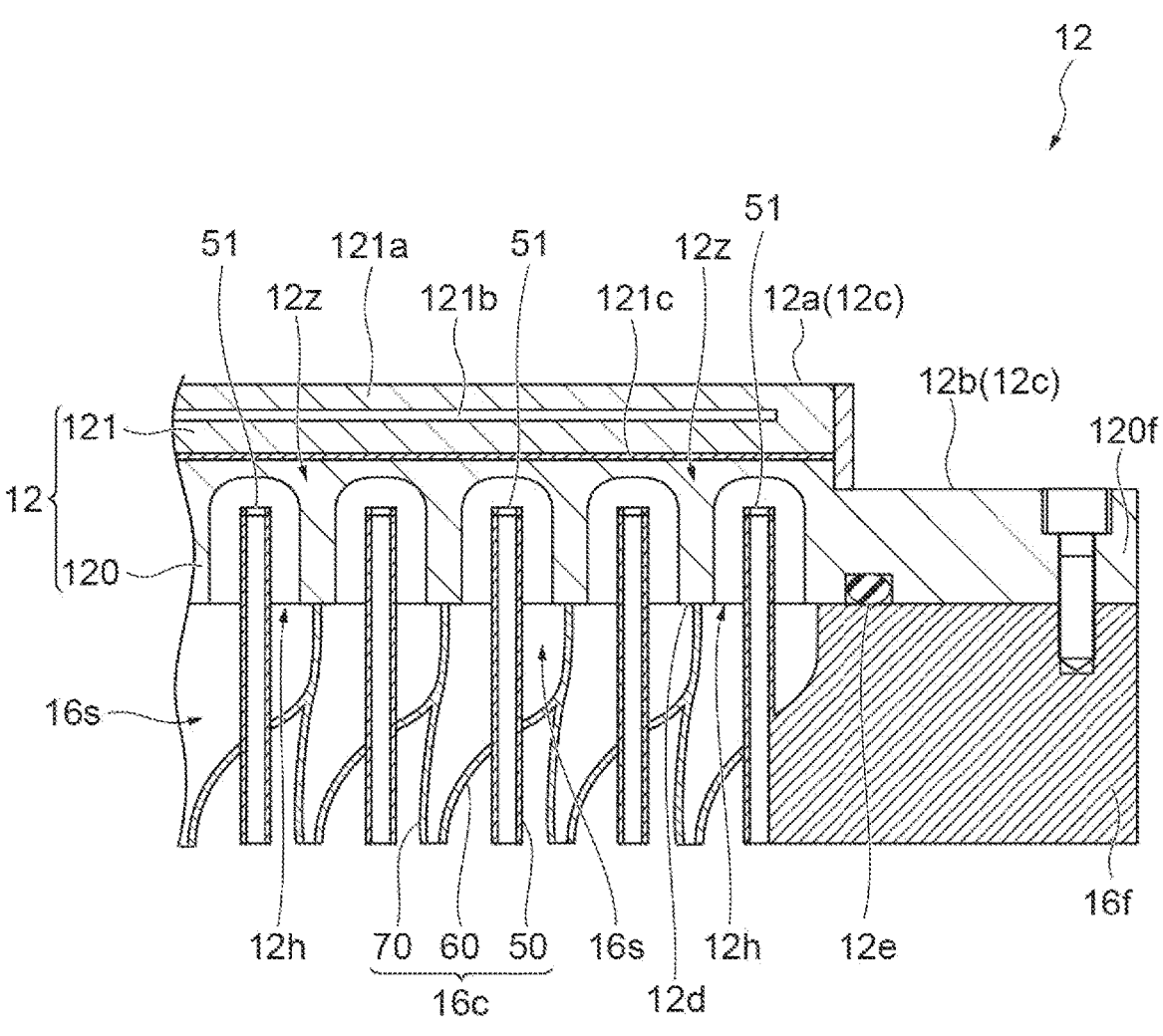
FIG. 3 is an enlarged cross-sectional view of a portion of a substrate support stage according to the exemplary embodiment.

A substrate support stage 12 will be described below in detail with reference to FIG. 3. As described above, the substrate support stage 12 is provided in a processing chamber 10. FIG. 3 is an enlarged cross-sectional view of a portion of a substrate support stage according to the exemplary embodiment.

The substrate support stage 12 has a substantial disk shape. As illustrated in FIG. 3, the substrate support stage 12 includes an upper surface 12c and a lower surface 12d. The upper surface 12c supports a substrate W placed thereon. The upper surface 12c includes a central region 12a and an annular region 12b. In one embodiment, the central region 12a is an upper surface of an electrostatic chuck 121, and the annular region 12b is a peripheral region of an upper surface of a base 120. The lower surface 12d is a surface opposite to the upper surface 12c. In one embodiment, the lower surface 12d is a lower surface of the base 120. The substrate support stage 12 provides a plurality of recesses 12h. The plurality of recesses 12h are opened downward. In one embodiment, the plurality of recesses 12h are provided by the base 120.

Figure 4A:
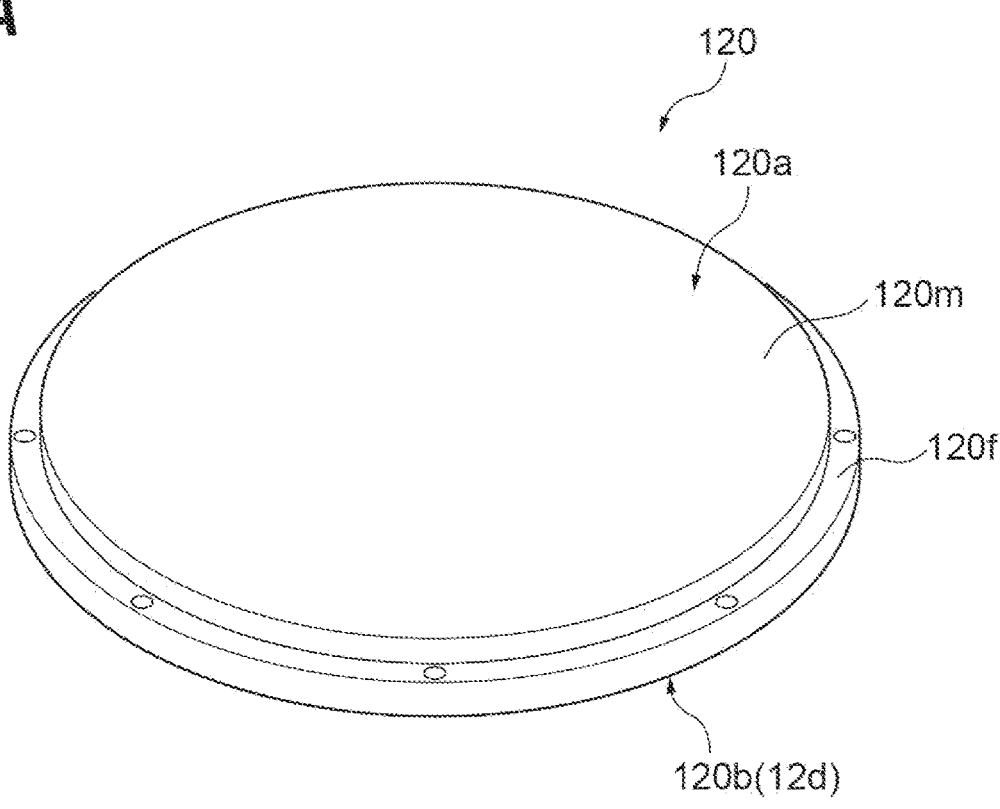
FIG. 4A is a perspective view of a base according to the exemplary embodiment.

FIG. 4A is a perspective view of the base according to the exemplary embodiment. As illustrated in FIG. 4A, the base 120 has a substantial disk shape, and has a first main surface 120a and a second main surface 120b facing each other. As illustrated in FIG. 3, the electrostatic chuck 121 is bonded to the first main surface 120a of the base 120 through an adhesive layer 121c. The second main surface 120b of the base 120 forms the lower surface 12d of the substrate support stage 12 as illustrated in FIG. 4A.

Figure 4B:
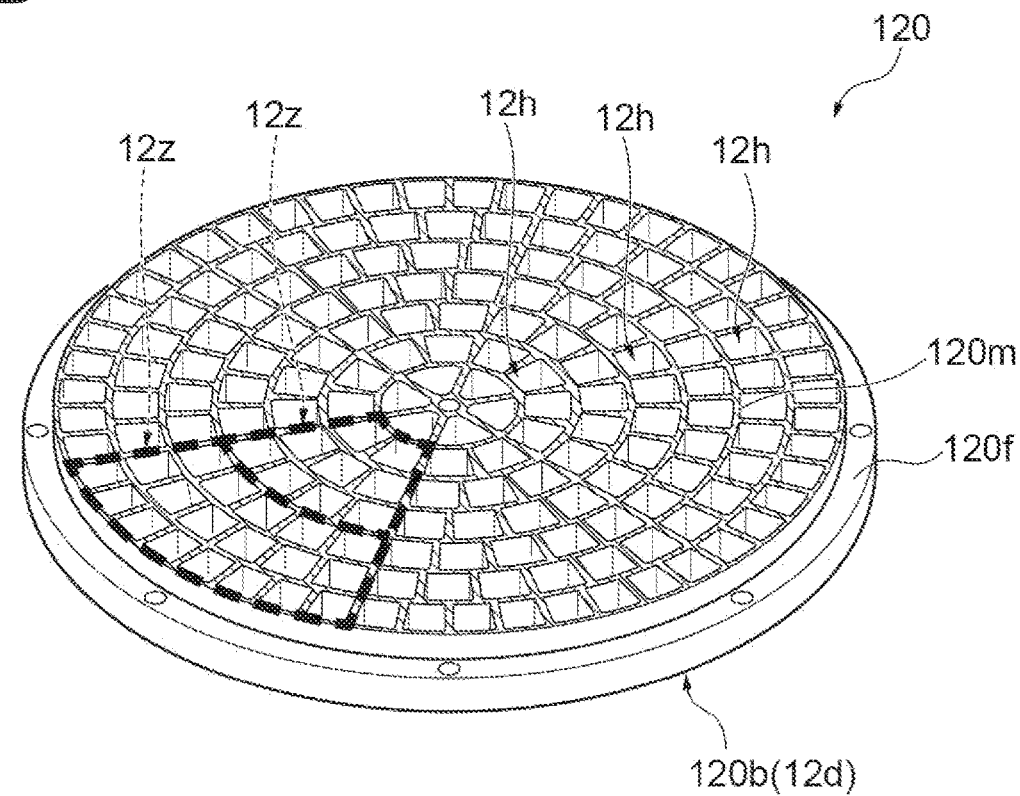
FIG. 4B is a partially-broken perspective view of the base according to the exemplary embodiment.

FIG. 4B is a partially-broken perspective view of the base according to the exemplary embodiment. FIG. 4B illustrates the base 120 in a state that an upper portion including the first main surface 120a is removed. As illustrated in FIGS. 4A and 4B, the base 120 may include a main portion 120m and a flange portion 120f. The main portion 120m is a portion having a substantially circular planar shape. The flange portion 120f is a portion having an annular planar shape. The flange portion 120f is continuous with the main portion 120m to surround an outer periphery of the main portion 120m.

As illustrated in FIG. 4B, the main portion 120m of the base 120 provides the plurality of the recesses 12h described above. The plurality of recesses 12h extend along a thickness direction of the base 120 and open in the second main surface 120b.

Each of the plurality of recesses 12*h* may have a substantially rectangular planar shape in which the width thereof increases from the center of the base 120 toward the outer side in a plan view. The plurality of recesses 12*h* are two-dimensionally arranged not to be included in each other. In addition, the planar shape of the plurality of recesses 12*h* is not limited to the rectangular shape, and may be a circular shape, or a polygonal shape such as a triangular shape or a hexagonal shape.

As illustrated in FIGS. 3 and 4B, the substrate support stage 12 may have a plurality of zones 12*z*. Each of the plurality of zones 12*z* may include one or more recesses 12*h* among the plurality of recesses 12*h*. As illustrated in FIG. 4B, each of the plurality of zones 12*z* is disposed in a plurality of regions concentric with the central axis of the substrate support stage 12. The plurality of regions include a circular region including the central axis of the substrate support stage 12 and one or more annular regions outside the circular region. At least one zone among the plurality of zones 12*z* is disposed in each of the circular region and the one or more annular regions. In one embodiment, the circular region is configured by one zone 12*z*. In addition, each of the plurality of annular regions is configured by a plurality of zones 12*z* arranged along the circumferential direction.

The base 120 may be formed of metal. The base 120 may be formed of stainless steel (for example, SUS304). Since stainless steel has a low thermal conductivity, escaping of heat of the electrostatic chuck 121 through the base 120 is prevented. The base 120 may be formed of aluminum. Since aluminum has a low resistivity, it is possible to reduce a power loss in the base 120 in a case where the base 120 is used as a radio frequency electrode.

Return to FIG. 3. As illustrated in FIG. 3, the plasma processing apparatus 1 includes a plurality of supply pipes 50, a plurality of partitions 60, and a plurality of collection pipes 70. In one embodiment, the plurality of supply pipes 50, the plurality of partitions 60, and the plurality of collection pipes 70 are provided by the heat exchanger 16.

Figure 5:
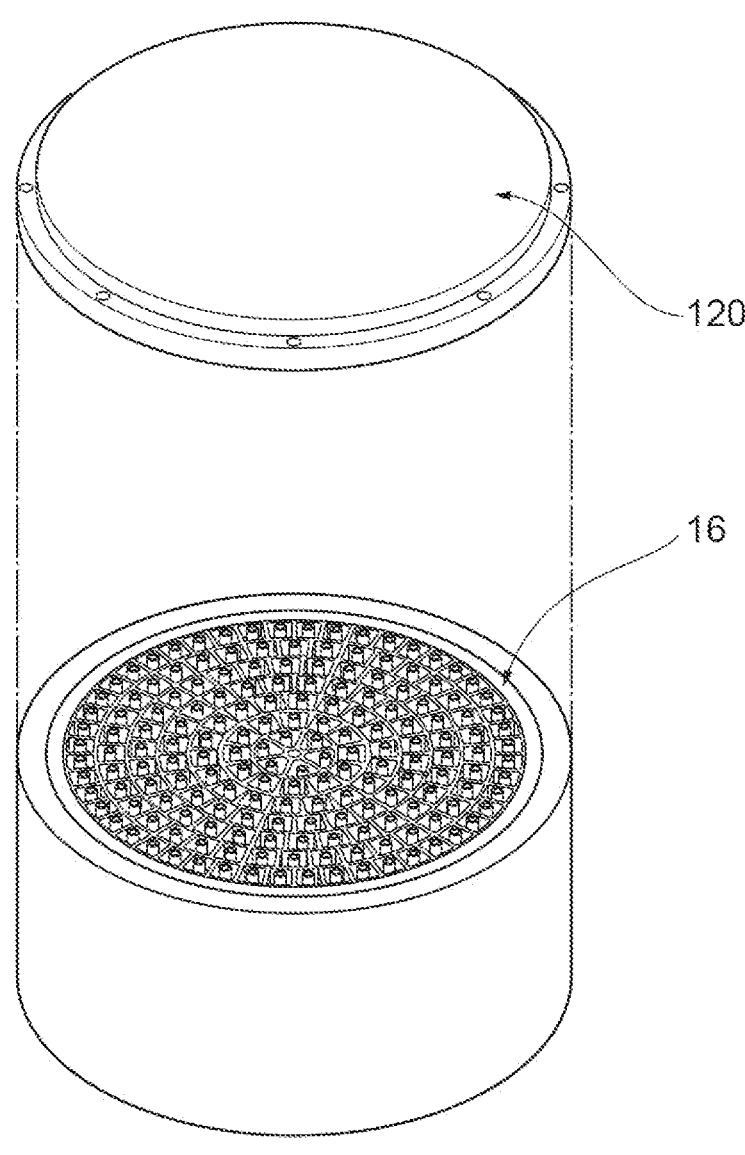
FIG. 5 is an exploded perspective view schematically illustrating the base and a heat exchanger according to the exemplary embodiment.

FIG. 5 is an exploded perspective view schematically illustrating the base and a heat exchanger according to the exemplary embodiment. As illustrated in FIG. 5, a substrate support portion 11 may further include a heat exchanger 16. The base 120 may be mounted on the heat exchanger 16. A portion of each of the plurality of supply pipes 50, the plurality of partitions 60, and a portion of each of the plurality of collection pipes 70 may be provided by the heat exchanger 16.

Figure 6:
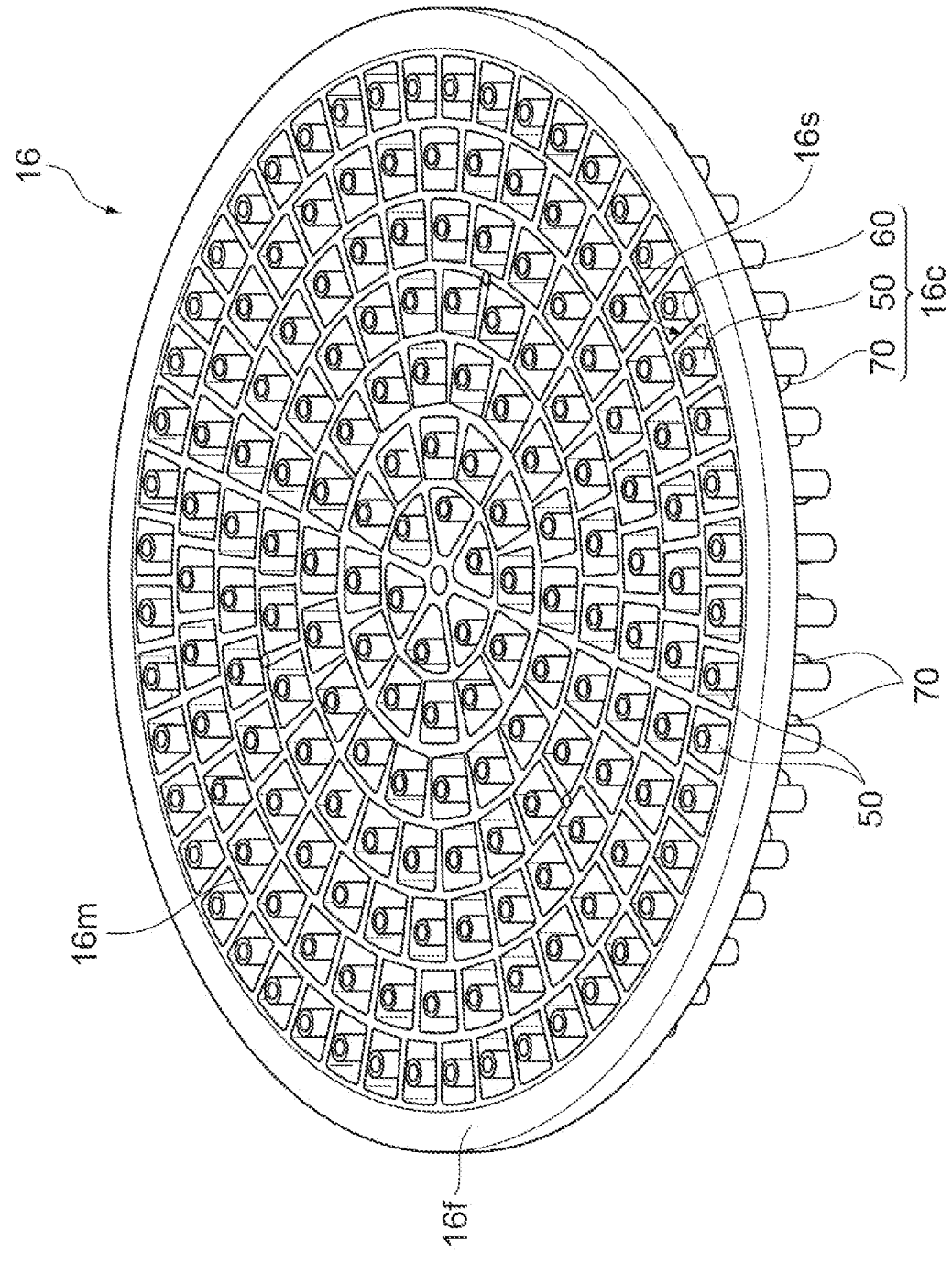
FIG. 6 is a perspective view of the heat exchanger according to the exemplary embodiment.
Figure 7A:
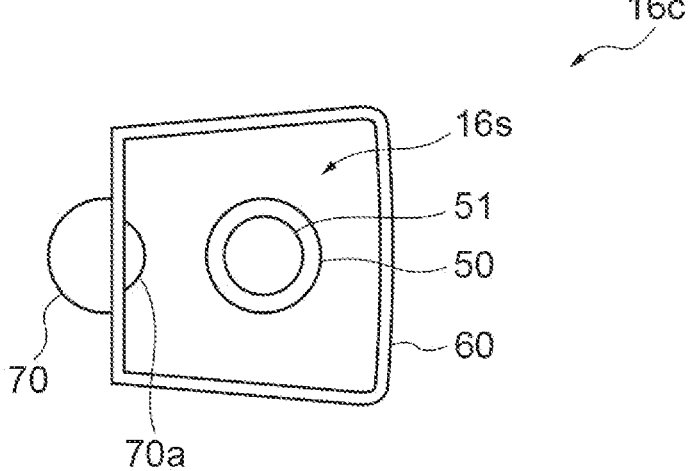
FIG. 7A is a plan view of a cell portion of the heat exchanger as an example.

The heat exchanger 16 will be described below with reference to FIGS. 3, 6, and 7. FIG. 6 is a perspective view of the heat exchanger according to the exemplary embodiment. FIG. 7A is a plan view of a cell portion of the heat exchanger as an example, and FIG. 7B is a perspective view of the cell portion of the example heat exchanger as the example.

The heat exchanger 16 may include a main portion 16*m* and a flange portion 16*f*. The main portion 16*m* is a region having a substantially circular planar shape. The flange portion 16*f* is a region having an annular planar shape, and is continuous with the main portion 16*m* to surround an outer periphery of the main portion 16*m*. As illustrated in FIG. 3, the flange portion 120*f* of the base 120 is disposed on the flange portion 16*f* of the heat exchanger 16. An O-ring 12*e* is held between the flange portion 16*f* and the flange portion 120*f*. The O-ring 12*e* seals a gap between the flange portion 16*f* and the flange portion 120*f* by being pressed between the flange portion 16*f* and the flange portion 120*f*.

The main portion 16*m* of the heat exchanger 16 provides a plurality of cell portions 16*c*. The plurality of cell portions 16*c* are respectively disposed below the plurality of recesses 12*h*. Each of the plurality of cell portions 16*c* may have a substantially rectangular planar shape in which the width increases from the center of the heat exchanger 16 toward to the outward side in a plan view. Each of the plurality of cell portions 16*c* provides a substantially rectangular space 16*s* in a plan view. A plurality of spaces 16*s* provided by the plurality of cell portions 16*c* are defined by the partitions 60. In one embodiment, the plurality of spaces 16*s* include a first space 16*x* and a second space 16*y*. In addition, the planar shape of the plurality of cell portions 16*c* is not limited to a rectangular shape, and may be a circular shape or a polygonal shape such as a triangular shape or a hexagonal shape.

Figure 7B:
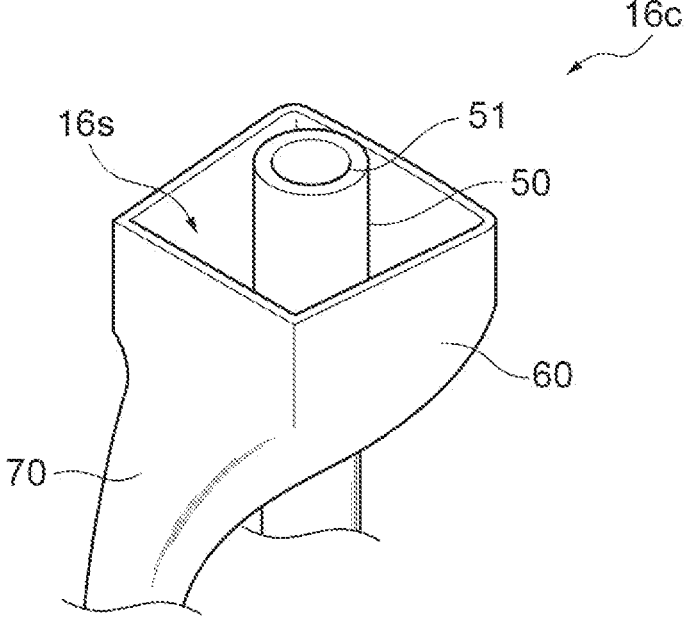
FIG. 7B is a perspective view of the cell portion of the example heat exchanger as the example.

As illustrated in FIGS. 6, 7A, and 7B, each of the plurality of cell portions 16*c* includes one supply pipe 50 among the plurality of supply pipes 50, one collection pipe 70 among the plurality of collection pipes 70, and one partition 60 among the plurality of partitions 60. In each of the cell portions 16*c*, the supply pipe 50 extends so that the central axis thereof coincides with the center line of the space 16*s*. The plurality of supply pipes 50 extend in parallel with each other. The plurality of supply pipes 50 are configured to supply the heat transfer medium to the plurality of recesses 12*h*, respectively. An upper end portion of each supply pipe 50 provides a nozzle 51 in the corresponding recess 12*h* among the plurality of recesses 12*h*. The nozzle 51 opens upward in the corresponding recess 12*h*.

As illustrated in FIG. 3, in each cell portion 16*c*, at least one partition 60 forms at least one space 16*s* together with the substrate support stage 12. The space 16*s* includes the recess 12*h*. The plurality of partitions 60 form the plurality of spaces 16*s* together with the substrate support stage 12. The plurality of spaces 16*s* include a plurality of the recesses 12*h*, respectively. Each of the plurality of partitions 60 is connected to the second main surface 120*b* of the base 120 to communicate with the recess 12*h* corresponding to each of the plurality of partitions 60 among the plurality of recesses 12*h*. Each of the plurality of partitions 60 surrounds an outer peripheral surface of the supply pipe 50 to provide the space 16*s* around the outer peripheral surface of the supply pipe 50.

The plurality of collection pipes 70 are configured to collect the heat transfer medium from the plurality of spaces 16*s*, respectively. As illustrated in FIG. 7A, each of the plurality of collection pipes 70 includes an opening end 70*a*. In each cell portion 16*c*, the opening end 70*a* of the collection pipe 70 is connected to the partition 60 so that the flow path of the collection pipe 70 communicates with the bottom portion of the space 16*s*. That is, the plurality of collection pipes 70 communicate with the plurality of recesses 12*h* through the plurality of spaces 16*s*, respectively. The plurality of collection pipes 70 are connected to the plurality of spaces 16*s*, respectively.

The plasma processing apparatus 1 further includes a circulation device C (see FIG. 2). The circulation device C may be a chiller. Therefore, the heat transfer medium may be a refrigerant. The circulation device C adjusts the temperature of the heat transfer medium. The circulation device is provided outside the processing chamber 10. The circulation device C is connected to the plurality of supply pipes 50 and the plurality of collection pipes 70. The circulation device C is configured to supply the heat transfer medium to the plurality of supply pipes 50 and collect the heat transfer medium from the plurality of collection pipes 70.

The heat exchanger 16 may be formed of resin, ceramic, or a material containing metal as the main component. The heat exchanger 16 may be formed of a material having a low thermal conductivity, for example, ceramic or resin, in order to suppress the influence of the adjacent cell portions 16c. The heat exchanger 16 may be partially formed of a different material in order to partially change the strength and/or the thermal conductivity of the heat exchanger 16. The heat exchanger 16 may be formed of the same material as the base 120. The base 120 and the heat exchanger 16 may be integrally formed by using, for example, a 3D printer.

Figure 8:
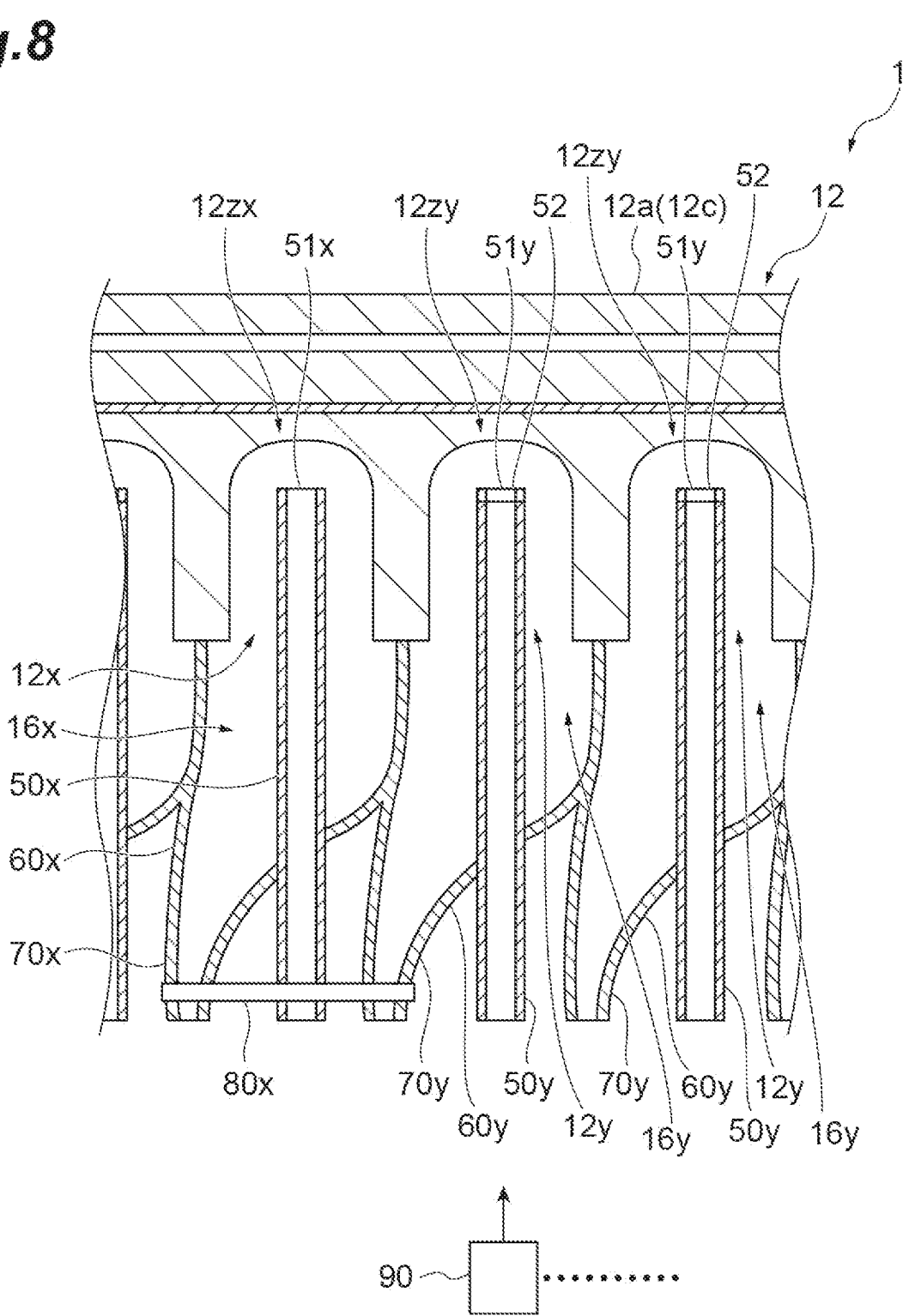
FIG. 8 is an enlarged cross-sectional view of a portion of a substrate support stage according to the exemplary embodiment.

The description will be made below with reference to FIG. 8. FIG. 8 is an enlarged cross-sectional view of a portion of a substrate support stage according to the exemplary embodiment. As illustrated in FIG. 8, the plurality of recesses 12h include a first recess 12x and a plurality of second recesses 12y. The plurality of spaces 16s include a first space 16x and a plurality of second spaces 16y. The first space 16x includes a first recess 12x, and each of the plurality of second spaces 16y includes the corresponding second recess 12y among the plurality of second recesses 12y. The first space 16x is defined by the corresponding first partition 60x among the plurality of partitions 60. Each of the plurality of second spaces 16y is defined by the corresponding second partition 60y among the plurality of partitions 60.

The plurality of zones 12z include a first zone 12zx and one or more second zones 12zy. In one example, the plurality of zones 12z include a plurality of second zones 12zy. The first zone 12zx includes at least the first recess 12x. Each of the plurality of second zones 12zy includes one or more second recesses 12y. In one example, each of the plurality of second zones 12zy includes a plurality of the second recesses 12y.

The plurality of supply pipes 50 include a first supply pipe 50x and a plurality of second supply pipes 50y. The first supply pipe 50x provides a first nozzle 51x as the nozzle 51 in the first recess 12x. Each of the plurality of second supply pipes 50y provides a second nozzle 51y as the nozzle 51 in the corresponding second recess 12y among the plurality of second recesses 12y.

The plurality of collection pipes 70 include a first collection pipe 70x and a plurality of second collection pipes 70y. The first collection pipe 70x is connected to the first space 16x. The plurality of second collection pipes 70y are connected to the plurality of second spaces 16y, respectively.

The plasma processing apparatus 1 includes one or more piezoelectric elements 52. In one embodiment, the plasma processing apparatus 1 includes a plurality of piezoelectric elements 52. The plurality of piezoelectric elements 52 are respectively disposed around a plurality of second nozzles 51y. Therefore, the number of the piezoelectric elements 52 is equal to the number of the second nozzles 51y. Each of the plurality of piezoelectric elements 52 reduces the cross-sectional area of an opening of the second nozzle 51y corresponding to a voltage applied thereto. The second supply pipe 50y and the second collection pipe 70y belonging to each of the plurality of cell portions 16c are described below as a second supply pipe 50yi and a second collection pipe 70yi. In addition, a piezoelectric element 52 provided around the second nozzle 51y of the second supply pipe 50yi is described below as a piezoelectric element 52i.

The plasma processing apparatus 1 includes one or more first thermoelectric elements 80x. In one embodiment, the plasma processing apparatus 1 includes a plurality of first thermoelectric elements 80x. Each of the plurality of first thermoelectric elements 80x is disposed between the first collection pipe 70x and a corresponding second collection pipe 70y to generate a first electromotive force V B corresponding to a temperature difference between the heat transfer medium in the first collection pipe 70x and the heat transfer medium in the corresponding second collection pipe 70y. The number of first thermoelectric elements 80x may be equal to the number of the second collection pipes 70y. In this case, each of the plurality of first thermoelectric elements 80x is disposed between the first collection pipe 70x and the corresponding second collection pipe 70y among the plurality of second collection pipes 70y. Alternatively, the number of the first thermoelectric elements 80x may be equal to the number of the second zone 12zy. In this case, each of the plurality of first thermoelectric elements 80x is disposed between the first collection pipe 70x and one second collection pipe 70y in the corresponding second zone 12zy. The first thermoelectric element 80x disposed between the first collection pipe 70x and the second collection pipe 70yi refers to as a first thermoelectric element 80xi below.

The plasma processing apparatus 1 includes one or more drive circuits 90. In one embodiment, the plasma processing apparatus 1 includes a plurality of drive circuits 90. Each of the plurality of drive circuits 90 is configured to apply, to the piezoelectric element 52i, a voltage corresponding to the magnitude of the first electromotive force $V_B$ generated by the first thermoelectric element 80xi. Alternatively, each of the plurality of drive circuits 90 may apply the voltage corresponding to the magnitude of the first electromotive force V B generated by the first thermoelectric element 80xi, to a plurality of piezoelectric elements 52 in the second zone 12zy to which the second collection pipe 70yi belongs.

In the plasma processing apparatus 1, since the voltage corresponding to the temperature difference between the heat transfer medium in the first collection pipe 70x and the heat transfer medium in the second collection pipe 70y is applied to the corresponding piezoelectric element 52, the cross-sectional area of the opening of the corresponding second nozzle 51y reduces in accordance with the temperature difference. When the flow velocity of the heat transfer medium supplied to the corresponding second recess 12y increases in accordance with the reduce in the cross-sectional area of the opening of the second nozzle 51y, the temperature at a portion of the substrate support stage 12 including the second recess 12y drops. As a result, the temperature difference between a portion of the substrate support stage 12 including the first recess 12x and the portion of the substrate support stage 12 including the second recess 12y reduces. Therefore, according to the plasma processing apparatus 1, the uniformity of the temperature distribution of the substrate W on the substrate support stage 12 is enhanced.

Figure 9A:
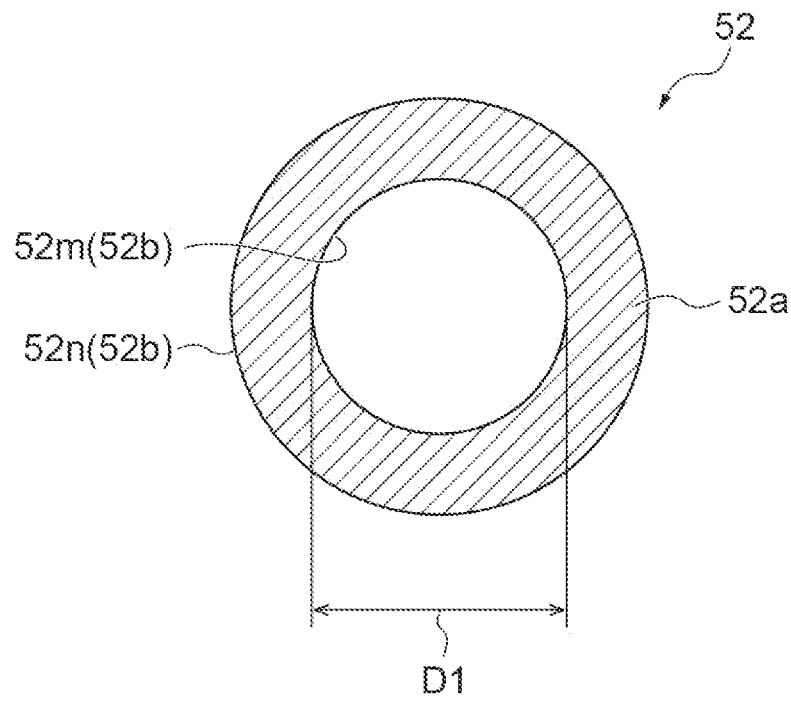
FIGS. 9A and 9B are end views schematically illustrating a configuration of a piezoelectric element according to the exemplary embodiment, respectively.
Figure 9B:
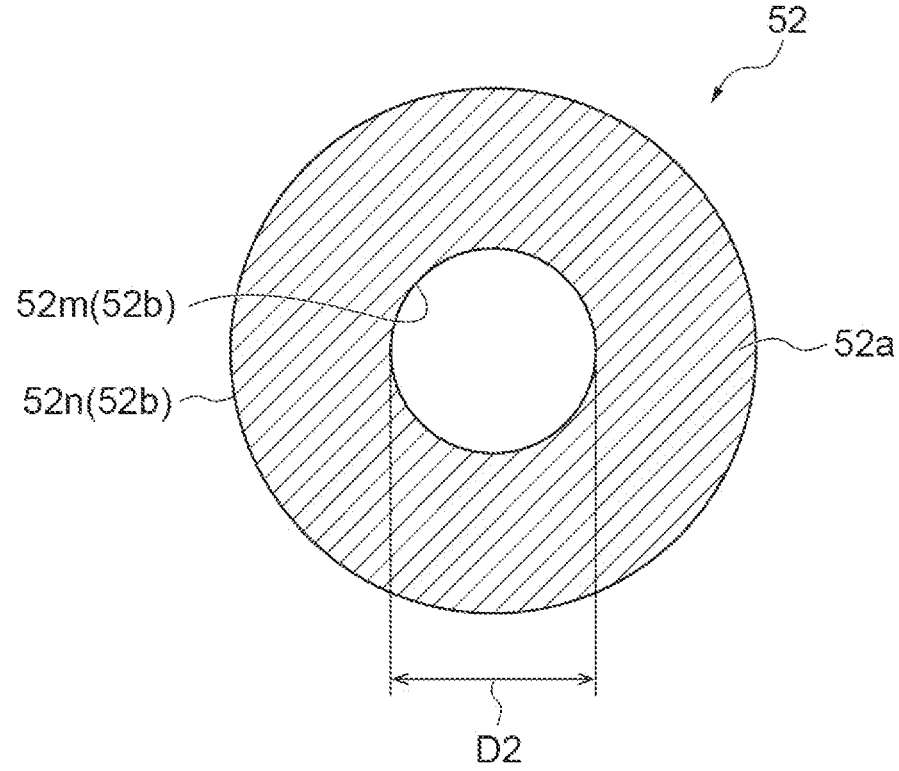

The description will be made below with reference to FIGS. 9A and 9B. FIGS. 9A and 9B are end views schematically illustrating a configuration of a piezoelectric element according to the exemplary embodiment, respectively. In one embodiment, the piezoelectric element 52 may include a piezoelectric member 52a and a pair of electrodes 52b. As one example, the pair of electrodes 52b is configured by an anode 52m and a cathode 52n. The piezoelectric member 52a is a ring-shaped piezoelectric member disposed around the opening of the second nozzle 51y. The pair of electrodes 52b is disposed along the inner periphery and the outer periphery of the piezoelectric member 52a. In one example, the anode 52m is disposed along the inner periphery of the piezoelectric member 52a, and the cathode 52n is disposed along the outer periphery of the piezoelectric member 52a.

FIG. 9A illustrates the piezoelectric element 52 in a state where no voltage is applied thereto. The diameter of the opening of the second nozzle 51$y$ when no voltage is applied to the piezoelectric element 52 is D1. FIG. 9B illustrates the piezoelectric element 52 in a state where a voltage is applied thereto in one exemplary embodiment. The diameter of the opening of the second nozzle 51$y$ when the voltage is applied thereto is D2. As illustrated in FIGS. 9A and 9B, when the voltage is applied to the piezoelectric element 52, the piezoelectric element 52 extends to both the inner peripheral side and the outer peripheral side. That is, the diameter D2 of the inner periphery of the piezoelectric element 52 in a state where the voltage is applied thereto becomes smaller than D1. Therefore, when the voltage is applied to the piezoelectric element 52, the flow velocity of the heat transfer medium supplied from the second supply pipe 50$y$ to the corresponding second recess 12$y$ increases.

Figure 10:
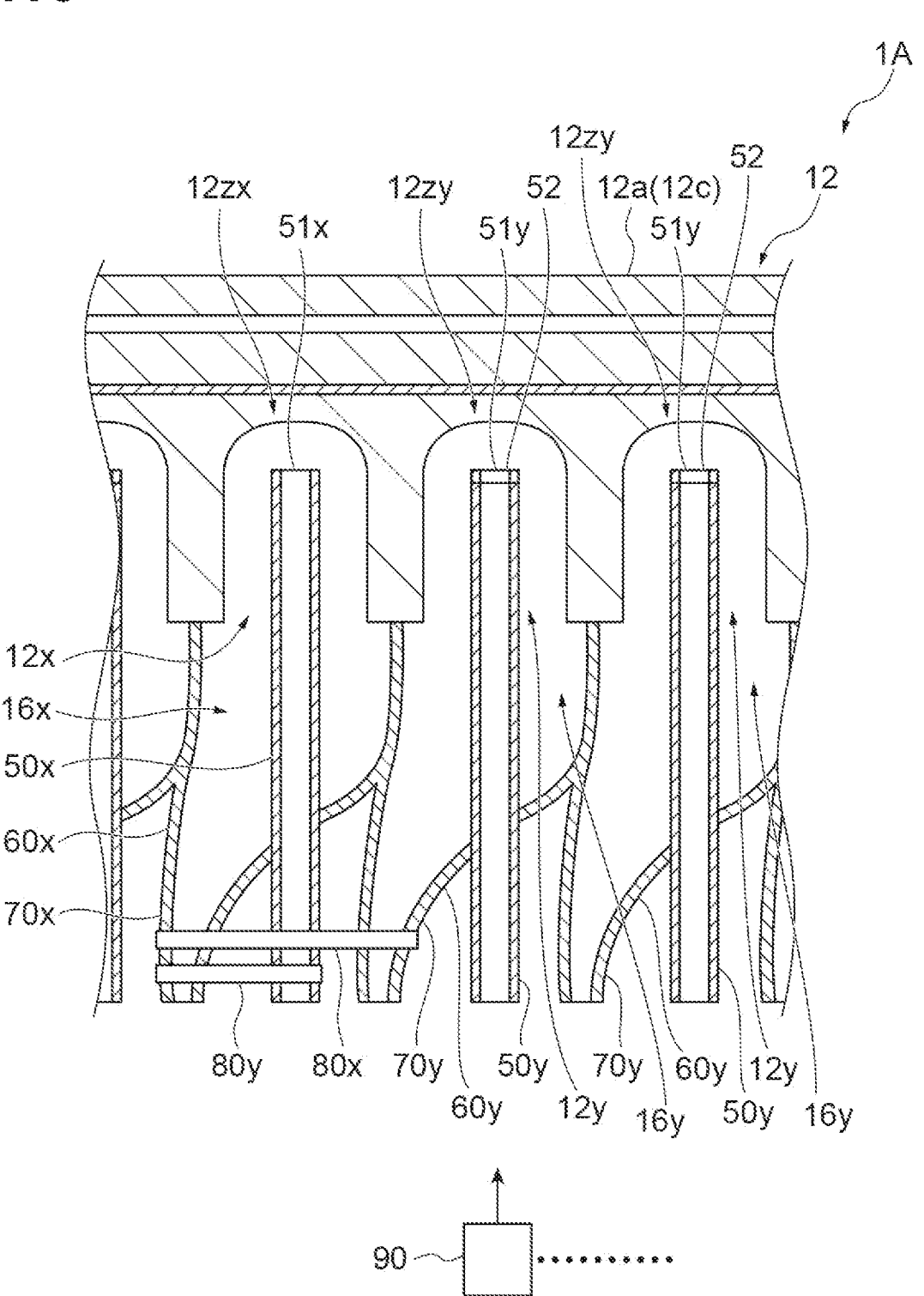
FIG. 10 is an enlarged cross-sectional view of a portion of a substrate support stage according to another exemplary embodiment.
Figure 11:
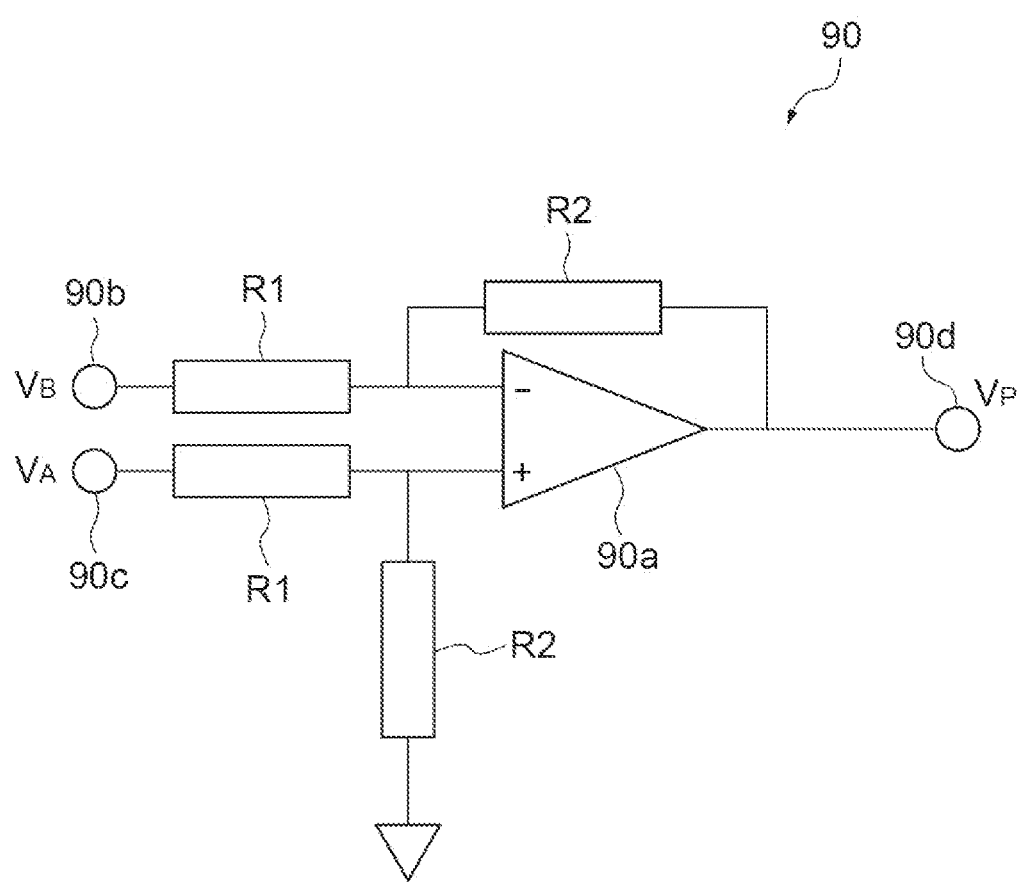
FIG. 11 is a circuit diagram illustrating an example of a drive circuit.

The description will be made below with reference to FIGS. 10 and 11. FIG. 10 is an enlarged cross-sectional view of a portion of a substrate support stage according to another exemplary embodiment. FIG. 11 is a circuit diagram illustrating an example of a drive circuit. A plasma processing apparatus 1A illustrated in FIG. 10 is another example of the substrate processing apparatus. The plasma processing apparatus 1A further includes a second thermoelectric element 80$y$. The second thermoelectric element 80$y$ is disposed between the first supply pipe 50$x$ and the first collection pipe 70$x$ to generate a second electromotive force V A corresponding to a temperature difference between the heat transfer medium in the first supply pipe 50$x$ and the heat transfer medium in the first collection pipe 70$x$. Each of the plurality of drive circuits 90 is configured to apply, to the piezoelectric element 52$i$, a voltage V p corresponding to a difference between the second electromotive force VA and the first electromotive force V B generated by the first thermoelectric element 80$xi$. Alternatively, each of the plurality of drive circuits 90 may apply the voltage V p corresponding to the difference between the second electromotive force V A and the first electromotive force V B generated by the first thermoelectric element 80$xi$, to the plurality of piezoelectric elements 52 in the second zone 12$zy$ to which the second collection pipe 70$yi$ belongs.

As illustrated in FIG. 11, in one embodiment, each of the plurality of drive circuits 90 may be a differential amplifier circuit. Each of the plurality of drive circuits 90 has an operational amplifier 90$a$, a pair of inputs 90$b$ and 90$c$, and an output 90$d$. The input 90$b$ is a terminal for receiving the first electromotive force $V_B$. The input 90$b$ is electrically connected to the inversion input of the operational amplifier 90$a$ through a resistor R1. The inversion input of the operational amplifier 90$a$ is connected to the output of the operational amplifier 90$a$ through a resistor R2. The input 90$c$ is a terminal for receiving the second electromotive force $V_A$. The input 90$c$ is electrically connected to the non-inversion input of the operational amplifier 90$a$ through a resistor R1. The non-inversion input of the operational amplifier 90$a$ is connected to the ground through a resistor R2. The output of the operational amplifier 90$a$ is connected to the output 90$d$. The voltage V p applied to the piezoelectric element 52 is output from the output 90$d$. In addition, the resistance value of the resistor R1 and the resistance value of the resistor R2 are predetermined so that the temperature difference between the heat transfer medium in the first collection pipe 70$x$ and the heat transfer medium in the second collection pipe 70$y$ reduces or eliminated by the voltage $V_p$.

Figure 12A:
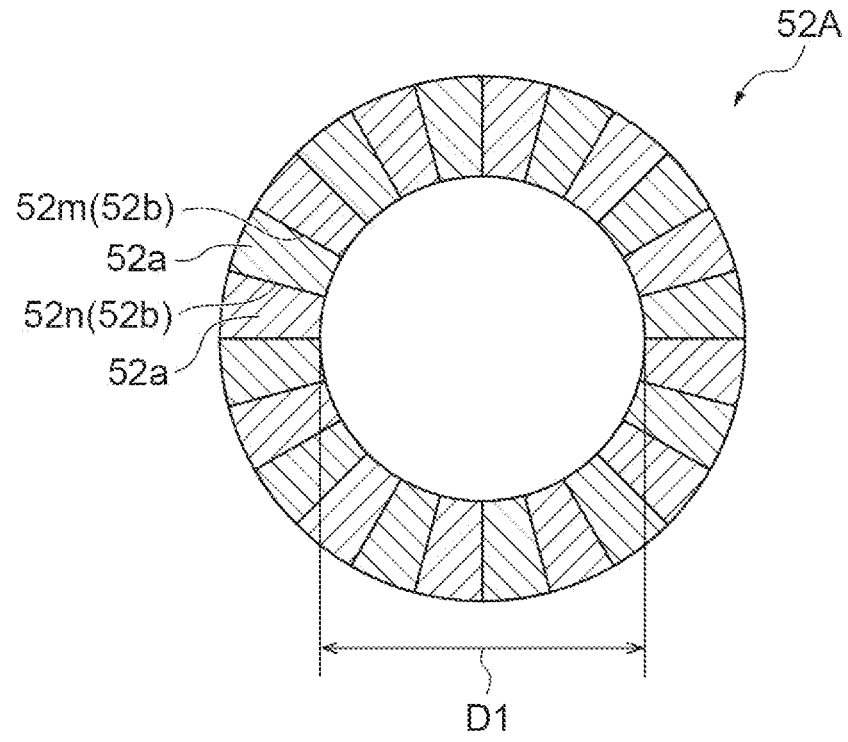
FIGS. 12A and 12B are end views schematically illustrating a configuration of a piezoelectric element according to another exemplary embodiment, respectively.
Figure 12B:
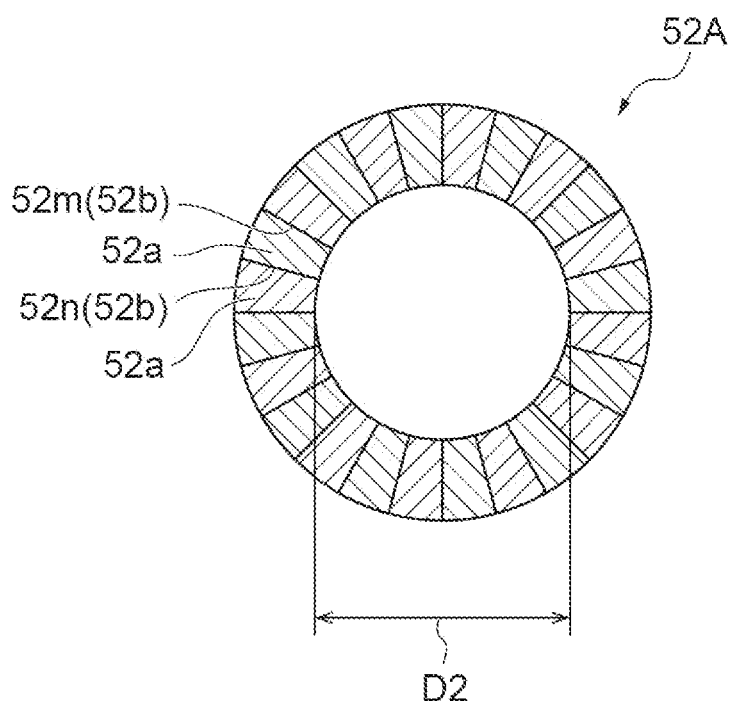

The description will be made below with reference to FIGS. 12A and 12B. FIGS. 12A and 12B are end views schematically illustrating a configuration of a piezoelectric element according to another exemplary embodiment, respectively. A piezoelectric element 52A illustrated in FIGS. 12A and 12B is an example of a piezoelectric element different from the piezoelectric element 52. The plasma processing apparatus 1 or 1A may adopt the piezoelectric element 52A instead of the plurality of piezoelectric elements 52. The piezoelectric element 52A is disposed around the opening of the corresponding second nozzle 51$y$.

The piezoelectric element 52A includes a plurality of piezoelectric members 52$a$ and a plurality of electrodes 52$b$. The plurality of piezoelectric members 52$a$ and the plurality of electrodes 52$b$ are alternately arranged around the opening of the corresponding second nozzle 51$y$ along the circumferential direction. The plurality of electrodes 52$b$ include a plurality of anodes 52$m$ and a plurality of cathodes 52$n$. The plurality of anodes 52$m$ and the plurality of cathodes 52$n$ are alternately arranged along the circumferential direction.

FIG. 12A illustrates the piezoelectric element 52A in a state where no voltage is applied thereto. The diameter of the opening of the second nozzle 51$y$ when no voltage is applied is D1. FIG. 12B illustrates the piezoelectric element 52A in a state where a voltage is applied to the piezoelectric element 52A. The diameter of the opening of the second nozzle 51$y$ when the voltage is applied is D2. As illustrated in FIGS. 12A and 12B, the diameter D2 of the inner periphery of the piezoelectric element 52A in a state where the voltage is applied thereto is smaller than D1. Therefore, the flow velocity of the heat transfer medium supplied from the second supply pipe 50$y$ to the corresponding second recess 12$y$ increases.

Figure 13A:
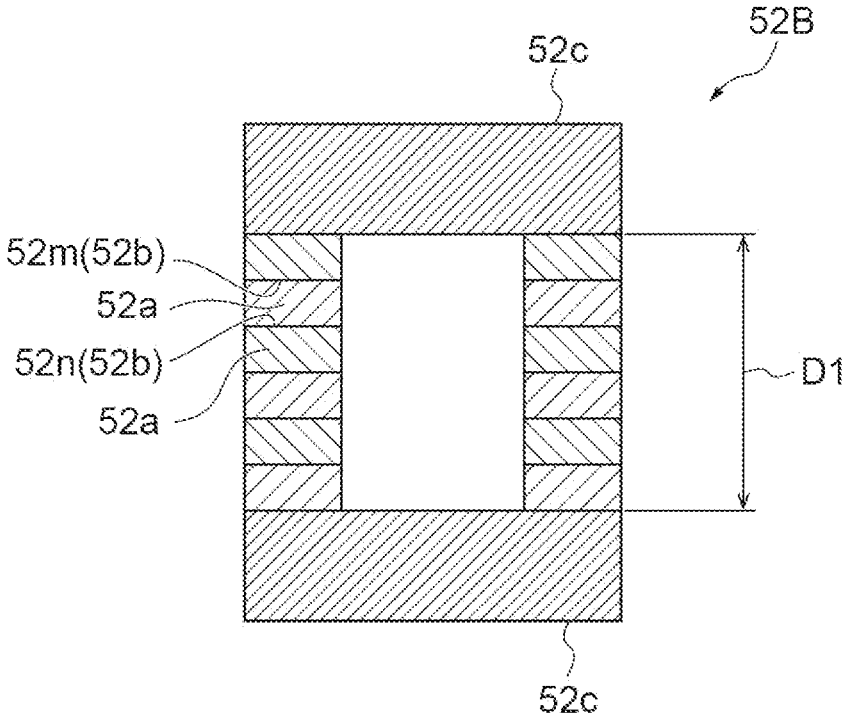
FIGS. 13A and 13B are end views schematically illustrating a configuration of a piezoelectric element according to still another exemplary embodiment, respectively.
Figure 13B:
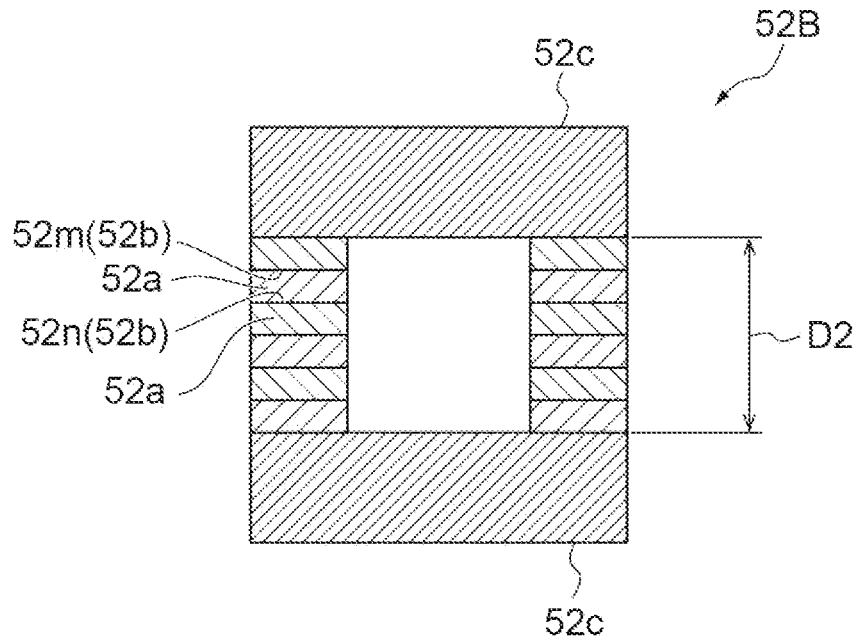

The description will be made below with reference to FIGS. 13A and 13B. FIGS. 13A and 13B are end views schematically illustrating a configuration of a piezoelectric element according to still another exemplary embodiment. A piezoelectric element 52B illustrated in FIGS. 13A and 13B is another example of a piezoelectric element different from the piezoelectric elements 52 and 52A. The plasma processing apparatus 1 or 1A may adopt the piezoelectric element 52B instead of the piezoelectric elements 52 and 52A. The piezoelectric element 52B is disposed around the opening of the corresponding second nozzle 51$y$.

The piezoelectric element 52B includes a plurality of piezoelectric members 52$a$, a plurality of electrodes 52$b$, and a pair of members 52$c$. The pair of members 52$c$ are disposed such that the opening of the second nozzle 51$y$ is located between the pair of members 52$c$. The plurality of piezoelectric members 52$a$ and the plurality of electrodes 52$b$ are alternately arranged between the pair of members 52$c$ and on both sides of the opening of the second nozzle 51$y$, and surround the opening of the second nozzle 51$y$ together with the pair of members 52$c$. The plurality of electrodes 52$b$ include a plurality of anodes 52$m$ and a plurality of cathodes 52$n$. The plurality of anodes 52$m$ and the plurality of cathodes 52$n$ are alternately arranged.

FIG. 13A illustrates the piezoelectric element 52 in a state where no voltage is applied to the piezoelectric element 52B. When no voltage is applied to the piezoelectric element 52B, the width of the opening of the second nozzle 51$y$ in a direction in which the pair of members 52$c$ is arranged is D1. FIG. 13B illustrates the piezoelectric element 52B in a state where a voltage is applied to the piezoelectric element 52B. When a voltage is applied to the piezoelectric element 52B, the width of the opening of the second nozzle 51$y$ in the direction in which the pair of members 52c is arranged is D2 and is smaller than D1. Therefore, when the voltage is applied to the piezoelectric element 52B, the flow velocity of the heat transfer medium supplied from the second supply pipe 50y increases.

Although the various exemplary embodiments have been described above, various additions, omissions, substitutions, and changes may be made without being limited to the exemplary embodiments described above. In addition, elements from different embodiments can be combined to form other embodiments.

Here, the various exemplary embodiments included in the present disclosure are described in [E1] to [E7] below.

[E1] A substrate processing apparatus comprising:
a processing chamber;
a substrate support stage that is disposed in the processing chamber, includes an upper surface that supports a substrate placed thereon and a lower surface on a side opposite to the upper surface, and provides a first recess and a second recess that open downward;
a first supply pipe that includes a first nozzle that opens upward in the first recess and is configured to supply a heat transfer medium to the first recess;
a second supply pipe that includes a second nozzle that opens upward in the second recess and is configured to supply the heat transfer medium to the second recess;
a first partition that forms a first space including the first recess together with the substrate support stage;
a second partition that forms a second space including the second recess together with the substrate support stage;
a first collection pipe that is configured to collect the heat transfer medium from the first space;
a second collection pipe that is configured to collect the heat transfer medium from the second space;
a piezoelectric element that is disposed around an opening of the second nozzle to reduce a cross-sectional area of the opening of the second nozzle in accordance with a voltage applied thereto;
a thermoelectric element that is disposed between the first collection pipe and the second collection pipe to generate an electromotive force corresponding to a temperature difference between the heat transfer medium in the first collection pipe and the heat transfer medium in the second collection pipe; and
a drive circuit that is configured to apply a voltage corresponding to a magnitude of the electromotive force, to the piezoelectric element.

In the embodiment of [E1], since the voltage corresponding to the temperature difference between the heat transfer medium in the first collection pipe and the heat transfer medium in the second collection pipe is applied to the piezoelectric element, the cross-sectional area of the opening of the second nozzle reduces in accordance with the temperature difference. When the flow velocity of the heat transfer medium supplied to the second recess increases in accordance with the reduce in the cross-sectional area of the opening of the second nozzle, the temperature at the portion of the substrate support stage including the second recess is lowered. As a result, the temperature difference between the portion of the substrate support stage including the first recess and the portion of the substrate support stage including the second recess reduces. Therefore, according to the embodiment of [E1], the homogeneity of the temperature distribution of the substrate on the substrate support stage is enhanced.

[E2] The substrate processing apparatus according to E1, further comprising:

a circulation device connected to the first supply pipe, the second supply pipe, the first collection pipe, and the second collection pipe, and is configured to supply the heat transfer medium to the first supply pipe and the second supply pipe and to collect the heat transfer medium from the first collection pipe and the second collection pipe.

[E3] The substrate processing apparatus according to E1 or E2, further comprising:
a second thermoelectric element disposed between the first supply pipe and the first collection pipe to generate a second electromotive force corresponding to a temperature difference between the heat transfer medium in the first supply pipe and the heat transfer medium in the first collection pipe,
wherein
the thermoelectric element comprises a first thermoelectric element,
the electromotive force comprises a first electromotive force,
the drive circuit is configured to apply a voltage corresponding to a difference between the second electromotive force and the first electromotive force to the piezoelectric element.

[E4] The substrate processing apparatus according to E3, wherein
the drive circuit is a differential amplifier circuit having a pair of inputs for receiving the second electromotive force and the first electromotive force.

[E5] The substrate processing apparatus according to E3 or E4, wherein
the substrate support stage has at least a first zone including the first recess and a second zone having a plurality of second recesses including the second recess,
the substrate processing apparatus includes a plurality of second supply pipes including the second supply pipe, each of the plurality of second supply pipes includes a plurality of second nozzles that open upward in the plurality of second recesses and is configured to supply the heat transfer medium to the plurality of second recesses,
the substrate processing apparatus includes a plurality of second partitions including the second partition, each of the plurality of second partitions forms a plurality of second spaces including the plurality of second recesses respectively, together with the substrate support stage,
the substrate processing apparatus includes a plurality of second collection pipes including the second collection pipe, each of the plurality of second collection pipes is configured to collect the heat transfer medium from the plurality of second spaces, and
the substrate processing apparatus includes a plurality of piezoelectric elements including the piezoelectric element, each of the plurality of piezoelectric elements is disposed around an opening of a corresponding second nozzle among the plurality of second nozzles to reduce a cross-sectional area of the opening of the corresponding second nozzle in accordance with the voltage applied thereto, and
the drive circuit is configured to apply the voltage corresponding to the difference to the plurality of piezoelectric elements.

[E6] The substrate processing apparatus according to any one of E1 to E5, wherein
the piezoelectric element includes a ring-shaped piezoelectric member disposed around the opening, and a pair of electrodes provided along an inner periphery and an outer periphery of the piezoelectric member.

[E7] The substrate processing apparatus according to any one of E1 to E5, wherein the piezoelectric element includes a plurality of piezoelectric members arranged along a circumferential direction around the opening, and a plurality of electrodes alternately arranged with the plurality of piezoelectric members, and the plurality of electrodes include a plurality of anodes and a plurality of cathodes alternately arranged along the circumferential direction.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the aspects following claims.

What is claimed is:

1. A substrate processing apparatus comprising:

a processing chamber;

a substrate support stage that is disposed in the processing chamber, includes an upper surface that supports a substrate placed thereon and a lower surface on a side opposite to the upper surface, and provides a first recess and a second recess that open downward;

a first supply pipe that includes a first nozzle that opens upward in the first recess and is configured to supply a heat transfer medium to the first recess;

a second supply pipe that includes a second nozzle that opens upward in the second recess and is configured to supply the heat transfer medium to the second recess;

a first partition that forms a first space including the first recess together with the substrate support stage;

a second partition that forms a second space including the second recess together with the substrate support stage;

a first collection pipe that is configured to collect the heat transfer medium from the first space;

a second collection pipe that is configured to collect the heat transfer medium from the second space;

a piezoelectric element that is disposed around an opening of the second nozzle to reduce a cross-sectional area of the opening of the second nozzle in accordance with a voltage applied thereto;

a thermoelectric element that is disposed between the first collection pipe and the second collection pipe to generate an electromotive force corresponding to a temperature difference between the heat transfer medium in the first collection pipe and the heat transfer medium in the second collection pipe; and a drive circuit that is configured to apply a voltage corresponding to a magnitude of the electromotive force, to the piezoelectric element.

2. The substrate processing apparatus according to claim 1, further comprising:

a circulation device connected to the first supply pipe, the second supply pipe, the first collection pipe, and the second collection pipe, and is configured to supply the heat transfer medium to the first supply pipe and the second supply pipe and to collect the heat transfer medium from the first collection pipe and the second collection pipe.

3. The substrate processing apparatus according to claim 1, further comprising:

a second thermoelectric element disposed between the first supply pipe and the first collection pipe to generate a second electromotive force corresponding to a temperature difference between the heat transfer medium in the first supply pipe and the heat transfer medium in the first collection pipe, wherein the thermoelectric element comprises a first thermoelectric element, the electromotive force comprises a first electromotive force, the drive circuit is configured to apply a voltage corresponding to a difference between the second electromotive force and the first electromotive force to the piezoelectric element.

4. The substrate processing apparatus according to claim 3, wherein the drive circuit is a differential amplifier circuit having a pair of inputs for receiving the second electromotive force and the first electromotive force.

5. The substrate processing apparatus according to claim 3, wherein the substrate support stage has at least a first zone including the first recess and a second zone having a plurality of second recesses including the second recess, the substrate processing apparatus includes a plurality of second supply pipes including the second supply pipe, each of the plurality of second supply pipes includes a plurality of second nozzles that open upward in the plurality of second recesses and is configured to supply the heat transfer medium to the plurality of second recesses, the substrate processing apparatus includes a plurality of second partitions including the second partition, each of the plurality of second partitions forms a plurality of second spaces including the plurality of second recesses respectively, together with the substrate support stage, the substrate processing apparatus includes a plurality of second collection pipes including the second collection pipe, each of the plurality of second collection pipes is configured to collect the heat transfer medium from the plurality of second spaces, and the substrate processing apparatus includes a plurality of piezoelectric elements including the piezoelectric element, each of the plurality of piezoelectric elements is disposed around an opening of a corresponding second nozzle among the plurality of second nozzles to reduce a cross-sectional area of the opening of the corresponding second nozzle in accordance with the voltage applied thereto, and the drive circuit is configured to apply the voltage corresponding to the difference to the plurality of piezoelectric elements.

6. The substrate processing apparatus according to claim 1, wherein the piezoelectric element includes a ring-shaped piezoelectric member disposed around the opening, and a pair of electrodes provided along an inner periphery and an outer periphery of the piezoelectric member.

7. The substrate processing apparatus according to claim 1, wherein the piezoelectric element includes a plurality of piezoelectric members arranged along a circumferential direction around the opening, and a plurality of electrodes alternately arranged with the plurality of piezoelectric members, and the plurality of electrodes include a plurality of anodes and a plurality of cathodes alternately arranged along the circumferential direction.

* * * * *